(12) United States Patent
Domes et al.

(10) Patent No.: US 10,032,755 B2
(45) Date of Patent: Jul. 24, 2018

(54) POWER SEMICONDUCTOR ARRANGEMENT HAVING A PLURALITY OF POWER SEMICONDUCTOR SWITCHING ELEMENTS AND REDUCED INDUCTANCE ASYMMETRY

(71) Applicant: Infineon Technologies AG, Neubiberg (DE)

(72) Inventors: Daniel Domes, Ruethen (DE);
Reinhold Bayerer, Reichelsheim (DE);
Waleri Brekel, Anroechte (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/345,751

(22) Filed: Nov. 8, 2016

(65) Prior Publication Data

US 2017/0141089 A1     May 18, 2017

(30) Foreign Application Priority Data

Nov. 12, 2015 (DE) .......... 10 2015 119 563
Feb. 17, 2016 (DE) .......... 10 2016 102 744

(51) Int. Cl.
*H01L 25/11* (2006.01)
*H01L 23/367* (2006.01)
*H01L 23/495* (2006.01)
*H01L 23/552* (2006.01)
*H01L 23/64* (2006.01)
(Continued)

(52) U.S. Cl.
CPC ........ *H01L 25/115* (2013.01); *H01L 23/3675* (2013.01); *H01L 23/49551* (2013.01); *H01L 23/49562* (2013.01); *H01L 23/552* (2013.01); *H01L 23/645* (2013.01);
(Continued)

(58) Field of Classification Search
None
See application file for complete search history.

(56) References Cited

U.S. PATENT DOCUMENTS 5,687,072 A    11/1997 Rinehart
2001/0035562 A1   11/2001 Kimura et al.
(Continued)

FOREIGN PATENT DOCUMENTS

DE        69635440 T2   8/2006
EP        0584668 A1    3/1994

*Primary Examiner* — Long Pham
(74) *Attorney, Agent, or Firm* — Murphy, Bilak & Homiller, PLLC

(57) ABSTRACT

A multiplicity of power semiconductor switching elements of the same type parallel have a load current terminal for a load current input and a load current terminal for a load current output. At least one outer load current terminal and at least one inner load current terminal per load current direction include a load current input and a load current output. At least one contacting device for common electrical contacting all of the load current terminals of the same load current direction includes a load current input and a load current output. The contacting device includes a plurality of terminal tongues which are respectively fastened on an associated load current terminal. The geometry and/or profile of the terminal tongue of an outer load current terminal differs from the geometry and/or profile of the terminal tongue of an inner load current terminal of the same contacting device.

17 Claims, 3 Drawing Sheets

(51) Int. Cl.
*H02M 7/00* (2006.01)
*H05K 7/20* (2006.01)
*H05K 7/14* (2006.01)

(52) U.S. Cl.
CPC .......... *H02M 7/003* (2013.01); *H05K 7/1432* (2013.01); *H05K 7/209* (2013.01)

(56) References Cited

U.S. PATENT DOCUMENTS

2002/0034088 A1   3/2002   Parkhill et al.
2017/0141089 A1*  5/2017   Domes ................ H01L 23/3675

\* cited by examiner

POWER SEMICONDUCTOR ARRANGEMENT HAVING A PLURALITY OF POWER SEMICONDUCTOR SWITCHING ELEMENTS AND REDUCED INDUCTANCE ASYMMETRY

PRIORITY CLAIM

This application claims priority to German Patent Application No. 10 2015 119 563.1 filed on 12 Nov. 2015, the content of said application incorporated herein by reference in its entirety.

BACKGROUND

The present invention relates to the field of power electronics. It relates to a power semiconductor arrangement which comprises a multiplicity of power semiconductor switching elements of the same type, preferably configured identically, arranged in a plane, or particularly in a row, and to be connected in parallel. A load current terminal for the load current input and a load current terminal for the load current output are provided per switching element. For rapid low-loss switching of currents, power transistors, in particular insulated gate bipolar transistors (IGBTs) are often used in power, conversion and transmission technology. In order to be able to switch heavy currents (in particular of the order of 1 kA or more), a multiplicity of individual power semiconductor switching elements, also referred to below as power transistors, are in this case electrically connected in parallel. The power transistors are in this case often combined in modules, which inter alia permits simplified handling during installation and replacement, allows defined and optimized cooling, satisfies a range of safety aspects, etc. Inside a module, component groups or submodules are in this case often formed from subsets of the multiplicity of power transistors.

In terms of the switching behavior of the power semiconductor arrangement, it is generally desirable that a current can be switched on or off as rapidly as possible. Particularly in the case of voltage-controlled power transistors, in which a current can be switched between a first power electrode and a second power electrode by means of a control voltage applied between the first power electrode and a control electrode, this is made difficult inter alia by inductive effects. These inductive effects not only affect the control voltage and cause a deviation of the effective control voltage from the specified control voltage, but also affect the load current output and load current input.

For instance, an inductive influence furthermore takes place as a result of time-varying currents in the rest of the power transistors because of so-called mutual inductances, In current-carrying conductors, i.e. also around the load current terminals, magnetic fields are formed. The electrical current flowing in the terminals leads to the formation of a magnetic flux. The way in which these magnetic fields propagate in the space around the current-carrying conductors, and how large the magnetic flux resulting therefrom is, depends on the magnetic properties of the surroundings. In this case, not only the magnetic properties of the materials in the surroundings but also the presence of further magnetic fields, caused by other load current terminals, play a crucial role. By connection of at least two power semiconductor switching elements in parallel, a magnetic influence of the individual load current-carrying paths takes place in such a way that their inductances can vary greatly. This leads to an asymmetrical current distribution above all during the switching instant, so that the switching behavior of the overall power semiconductor arrangement is influenced thereby.

It has been found that the effect caused by the mutual inductance in power semiconductor arrangements consisting of a plurality of power semiconductor switching elements can be kept as small as possible when the load current terminals for the load current input and those for the load current output are arranged geometrically as close as possible next to one another, so that their magnetic fields can influence one another in a way which reduces the inductance. This is readily possible inside such an arrangement, but outer load current terminals, to which it is not possible to assign a load current terminal of opposite current direction so as to have an inductance-reducing effect, still always remain because of the geometrical arrangement. Overall, in the arrangement of a plurality of power semiconductor switching elements, the problem remains that the magnetic field set up enclosing the outer load current terminals in relation to the geometrical midpoint of the arrangement, or outer pairs thereof, differs from the magnetic field enclosing the inner load current terminals in relation to the geometrical midpoint of the arrangement, or inner pairs thereof, and therefore switching behavior of the outer power semiconductor switching elements undesirably turns out to be different than that of the inner power semiconductor switching elements because of this nonuniformity, in particular asymmetry.

SUMMARY

Against this background, the object of the invention is now to provide a power semiconductor arrangement having a multiplicity of power semiconductor switching elements, preferably configured identically, arranged in a plane or particularly in a row and to be connected in parallel, the switching behavior of which is improved, and particularly in which switching behaviors of the individual power semiconductor switching elements are better matched to one another. This object is achieved by a power semiconductor arrangement as claimed in claim 1. The dependent claims respectively relate to advantageous configurations. It should be pointed out that the features mentioned individually in the claims may be combined with one another in any desired technologically feasible way, and present further configurations of the invention. The description, particularly in connection with the figures, additionally characterizes and specifies the invention.

DETAILED DESCRIPTION

Figure 1:
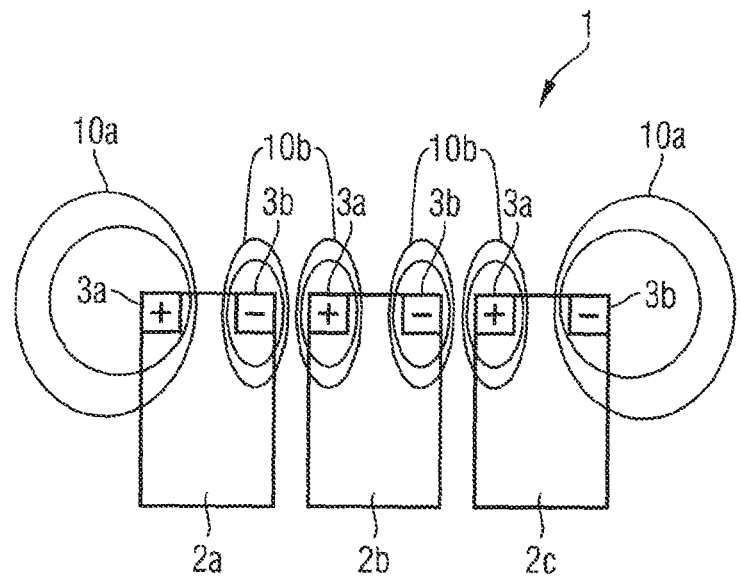
FIG. 1 depicts a power semiconductor arrangement consisting of three identical parallel-connected half-bridge modules, according to an embodiment.

The invention relates to a power semiconductor arrangement which comprises a multiplicity of power semiconductor switching elements of the same type arranged in a plane and to be connected in parallel. Each power semiconductor switching element comprises one load current terminal per load current direction, i.e., one load current terminal for the load current input and one load current terminal for the opposite load current direction, namely the load current output. According to embodiments of the invention, therefore, in relation to the power semiconductor arrangement there are a plurality of load current terminals per load current direction comprising a load current input and a load current output. The term "the same type" is to be interpreted broadly and means, for example, a correspondence in design but not necessarily an identical switching behavior. For example, the power semiconductor switching element is in each case an IGBT (insulated gate bipolar transistor) or in each case a MOSFET (metal oxide semiconductor field-effect transistor). Furthermore, a second—different or equal—number of antiparallel-connected diodes may be provided, in particular as protective diodes ("freewheeling", "snubber" or "flyback" diodes), particularly in power semiconductor switching elements which are configured as or for use in bridge or half-bridge circuits. Preferably, at least subsets of the power semiconductor switching elements of the power semiconductor arrangement are configured identically. This is intended to mean primarily an identical electrical switching behavior in the case of isolated arrangement of the relevant power semiconductor switching elements. In addition, an identical design and/or identical dimensioning and/or identical electrical interconnection may furthermore be provided.

According to embodiments of the invention, the power semiconductor arrangement furthermore comprises at least one contacting device for electrical contacting of a plurality, in particular all, of the load current terminals of the same load current direction comprising a load current input or a load current output. For example, two contacting devices are provided, one for the load current input and one for the load current output. The contacting device may for example consist of a conductive material, such as a metal or metal alloy. The contacting device comprises a plurality of terminal tongues, which are respectively configured and provided for fastening on an associated load current terminal. Fastening is meant, for example, to mean fastening on the associated load current terminal by means of screw fastening means. A terminal tongue is intended to mean the part of the contacting device which comprises at least the section intended for arrangement directly adjacent to the associated load current terminal. Preferably, the contacting device comprises a common conductor section relating to the load current input or load current output, and the terminal tongues are the section, remaining between this common conductor section and the relevant load current terminal, intended for the current branching to or from the relevant load current terminal. Preferably, the contacting devices of the load current output and the load current input are configured symmetrically with respect to one another.

The terminal tongue is for example a flat conductor which has been lasered or stamped and optionally shaped by embossing, for example a sheet-metal strip.

According to embodiments of the invention, the power semiconductor arrangement, i.e. the geometrical and spatial arrangement of the plurality of power semiconductor switching elements, as considered for the respective load current direction, defines at least one outer load current terminal and at least one inner load current terminal. The terms "outer" and "inner" respectively relate to the distance of the respective load current terminal from the geometrical midpoint of the power semiconductor arrangement, so that the distance of the outer load current terminal is greater in magnitude than that of the inner load current terminal, respectively from the geometrical midpoint of the power semiconductor arrangement.

In order to improve the switching behavior at least of the inner power semiconductor switching elements, provision is preferably made that, apart from the outermost load current terminals, i.e., the load current terminals arranged furthest away from the geometrical midpoint of the power semiconductor arrangement, the remaining load current terminals of the load current arrangement are arranged in such a way that the load current input of a power semiconductor switching element is arranged in immediate proximity to a load current output of another power semiconductor switching element. By the geometrical pairing of the load current terminals of different power semiconductor switching elements, the switching behavior thereof can be improved by reducing the inductive impedance.

According to embodiments of the invention, the geometry and/or the profile of the terminal tongue of at least one outer load current terminal differs from the geometry or the profile of the terminal tongue of an inner load current terminal of the same contacting device. The term geometry is to be interpreted broadly and relates, for example, to the dimensioning. By the variation of the geometry or the profile of the terminal tongues or combinations thereof, it is possible to counteract the nonuniformity, in particular asymmetry, resulting from the arrangement of the terminals, of the magnetic fields enclosing the load currents, and the inductances resulting therefrom, described in the introduction, and therefore to match the switching behaviors of the plurality of power semiconductor switching elements to one another.

Preferably, the geometry and/or the profile of the terminal tongue of at least one outermost load current terminal of a contacting device differs from the geometry or the profile of an inner load current terminal. More preferably, the geometry and/or the profile of the terminal tongue of at least one outermost load current terminal of a contacting device differs from the geometry or the profile of the terminal tongue of all remaining load current terminals of the same contacting device. An outermost load current terminal is intended to mean the load current terminal of the same load current direction, and therefore the load current terminal to be contacted by the same contacting device, with the greatest distance from the geometrical midpoint of the arrangement. This may relate to one or more load current terminals, usually one, per load current direction.

Preferably, the terminal tongue fastened on the inner load current terminal has a different, preferably smaller, minimum cross section compared with the terminal tongue, fastened on the outer load current terminal, of the same contacting device. The minimum cross section is intended to mean the smallest conductor cross section perpendicularly to the load current direction in the profile of the respective terminal tongue in the load current direction. Preferably, the minimum cross section is provided in combination with a flat metal conductor, and for example all terminal tongues of the power semiconductor arrangement are configured as flat conductors formed of sheet metal, such as sheet copper. Preferably, the contacting devices are respectively configured as flat conductors made of sheet metal, such as sheet copper, for example by stamping.

Preferably, the profile of the terminal tongue fastened on the inner load current terminal has a different, preferably larger, number of bends and/or a different, preferably larger, number of curvatures and/or a different, preferably larger, curvature, in other words a different, preferably smaller, radius of curvature, compared with the terminal tongue fastened on the outer load current terminal. For example, the outer terminal tongue is configured to be planar and the inner terminal tongue is bent several times. A bend or curvature is intended to mean a direction alternation or direction changes of the profile of the relevant terminal tongue in the load current direction.

Preferably, the terminal tongue fastened on the inner load current terminal has a different, preferably larger, number of slots and/or a different, preferably larger, number of constrictions compared with the terminal tongue fastened on the outer load current terminal.

According to another configuration, the terminal tongue fastened on the inner load current terminal has a different, preferably smaller, overlap with a terminal tongue of another contacting device with the opposite load current direction, compared with the terminal tongue, fastened on the outer load current terminal, of the same contacting device of the one load current direction.

By the aforementioned measures, respectively used individually or in combination, the nonuniformity, resulting from the arrangement of the terminals, of the magnetic fields enclosing the load terminals, and the nonuniformity thereby caused in the switching behavior of the power semiconductor switching elements, are therefore counteracted by relatively simple design means.

According to one preferred variant, the fastening points of the plurality of load current terminals of one of the load current directions comprising a load current input and a load current output define a common line or plane, and the terminal tongue fastened on the inner load current terminal has a different, for example larger, elevation, facing away from the associated load current terminal, compared with the terminal tongue fastened on the outer load current terminal with respect to the plane or line. For example, the outer load current terminal is configured to be flat and arranged in the plane, and the inner load current terminal has a hump-shaped elevation.

According to embodiments the invention, a conductive layer for magnetic shielding is furthermore provided. A conductive layer for magnetic shielding is intended to mean layers which, because of their arrangement proportion in relation to at least one associated load current terminal, are suitable for at least influencing the magnetic field generated by the respective load current, for example by bending the field lines, Preferably, the conductive layer for magnetic shielding is arranged in order to displace the magnetic flux that is induced by a load current flowing through the associated load current terminal in the direction of this load current terminal, compared with the magnetic field situation which would be set up without the provision of this conductive layer for magnetic shielding.

Preferably, the layer is essentially made of soft magnetic material, such as ferromagnetic material, a metal such as copper, aluminum, iron, and/or of a metal alloy such as steel or a nickel/iron alloy, such as Mu-metal. For example, it is a metal sheet, for example a metal sheet bent in the shape of a U, or a coating which has been applied by mechanical, chemical, thermal or thermomechanical methods, in particular physical or chemical vapor deposition or sputtering. In another configuration, the layer is a layer of a foil or a foil layer structure. The use of conductive metallic materials ensures electromagnetic shielding because of the eddy current induction. For electrical insulation, the layer is for example preferably enclosed by an insulation material, such as plastic.

In this case, at least one outer load current terminal is provided which differs at least in terms of its minimum distance from the magnetic shielding means from an inner load current terminal of the same load current direction. By this variation of the distance from the means with a magnetically shielding effect, it is possible to counteract the asymmetry described in the introduction, resulting from the arrangement of the terminals, of the magnetic fields enclosing the load currents and therefore to match the switching behavior of the plurality of power semiconductor switching elements.

According to one preferred configuration, the minimum distance of an outer load current terminal from the conductive layer is less than the minimum distance of an inner load current terminal from the electrically insulated conductive layer.

Preferably, for each load current direction, the outermost load current terminal has the smallest minimum distance from the magnetic shielding means, in order to effectively achieve at this load current terminal, which generally has the greatest distance from load current terminals of the oppositely oriented current direction or the fewest load current terminals of the oppositely oriented current direction in its proximity, a reduction of the inductive impedance and therefore an improvement of the switch-on behavior of the relevant outermost power semiconductor switching element.

According to one preferred variant, the conductive layer extends at least in sections along one of the extent directions of the power semiconductor arrangement, and more preferably extends exclusively along one of the extent directions of the power semiconductor arrangement.

Preferably, the power semiconductor arrangement comprises a heat sink, and the conductive layer is fastened on the heat sink or is formed thereby for magnetic shielding.

Preferably, the layer is provided by further electrical terminal devices of the power semiconductor arrangement. For example, the conductive layer is part of a terminal device, carrying an alternating voltage, of the power semiconductor arrangement.

Preferably, the power semiconductor arrangement comprises a plurality of modules containing a subset consisting of one or more power semiconductor switching elements, and the modules respectively comprise a module housing enclosing the respective subset. The conductive layer for magnetic shielding is for example provided by at least one module housing or is fastened thereon, for example by a force, form or material fit. For example, the subsets comprise an identical number of power semiconductor switching elements.

The modules can be embodied as a single switching device, such as an IGBT or MOSFET. In that case, load current flows between the load current terminals of the device, e.g., the IGBT collector and the IGBT emitter terminal. In the case of switching events, rapid current transients can be found at both load current terminals of the device at the same time. Alternatively, the modules can be embodied as a half-bridge consisting of two switching devices, e.g., two IGBT devices and their diode. In that case, the module includes a third AC terminal at the node between the output terminals of the two switching devices. In that case, load current flows from either one the load current terminals of the two switching devices to the third AC terminal, and generally does not flow between both load current terminals of the two switching devices. However, the transient reverse recovery current of the freewheeling diodes in the two switching devices temporarily results in current flowing between both load current terminals of the two switching devices.

Preferably, the module housings of the power semiconductor arrangement are configured identically. The material of the module housing comprises a plastic, such as a glass fiber-reinforced plastic and/or thermoplastic.

Preferably, the module housings have long and short sides respectively perpendicular to the plane defined by the power semiconductor arrangement, which are arranged in such a way that, apart from one side of the outermost module housing, a long side of a module housing is respectively arranged in immediate proximity, for example adjacent, to a side of another module housing.

In the aforementioned arrangement, the conductive layer for magnetic shielding is preferably fastened on a long side of the module housing or is formed by a long side of the module housing, and they are preferably fastened exclusively on a long side of the module housing or formed exclusively by a long side of the module housing.

Embodiments of the invention furthermore relates to the use of the power semiconductor arrangement in one of the embodiments described above as a power converter. Power converters are intended to mean stationary electrical apparatuses or systems—i.e. without moving parts, but not necessarily static—for converting an electrical current type fed in (direct current, alternating current) to the other respective type, or for modifying characteristic parameters such as the voltage and the frequency.

These and other objects, advantages and features of the invention will become apparent from the following detailed description of preferred exemplary embodiments of the invention in connection with the drawings.

Figure 2:
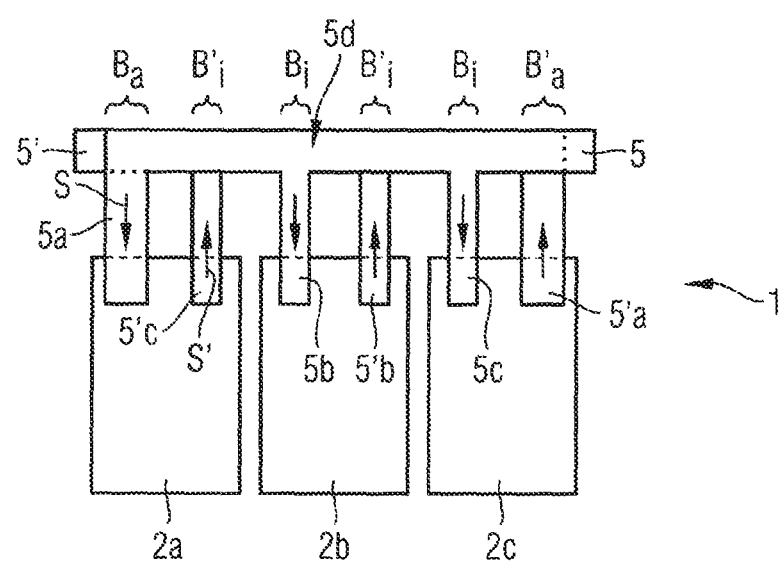
FIG. 2 depicts a contacting device for a power semiconductor arrangement, according to an embodiment.

FIG. 1 shows a power semiconductor arrangement consisting of three identical parallel-connected half-bridge modules 2a, 2b, 2c arranged linearly in a common plane, which have identical housings with identical and identically arranged and connected power semiconductor switching elements contained therein. The load current terminals 3a are used for the load current input and the load current terminals 3b for the load current output. The load current terminals 3a and the load current terminals 3b are respectively contacted by means of a contacting device (not represented), and the load currents are respectively input and output by means thereof. In FIG. 1, representation of the contacting device has been omitted. Circles 10a, or 10b, indicate the associated magnetic flux lines caused by the load currents. The effect of the arrangement of the modules 2a, 2b, 2c, in which the load current terminals 3a, 3b with opposite load current directions are arranged as close as possible to one another, is that the density of the inner magnetic field lines 10b, i.e. for the load terminals 3a, 3b closer to the geometrical midpoint of the arrangement, is higher than the density of the magnetic flux lines 10a of the outer load terminals 3a, 3b. This magnetic field situation leads to a different magnetic impedance for an inner load current terminal of the load current terminals 3a or 3b compared with an outer load current terminal. The resulting inductance is indirectly proportional to the magnetic impedance, i.e. the inner inductance is less than an inductance at the outer load current terminals of the load current terminals 3a, 3b. Disadvantageous asymmetries occur in the switching behavior of the switching power semiconductor switching elements provided in the modules 2a, 2b, 2c. In order to compensate for or balance these different inductances, according to the teaching of this invention, as shown in FIG. 2, a special contacting device 5 or 5' is in each case used for common electrical contacting of all load current terminals of the same load current direction comprising a load current input S and a load current output S'. The contacting device 5 or 5' respectively comprises a plurality of terminal tongues 5a, 5b, 5c. Only the contacting device 5 provided for the load current input S will be described below by way of example, the comments applying equally for the contacting device 5' of the load current output S'. The terminal tongues 5a, 5b, 5c are respectively fastened on an associated load current terminal of the same load current direction, but differ in the embodiment shown in FIG. 2 in the geometry of the individual terminal tongues, so that the outer, here the outermost load current terminal 5a in relation to the geometrical middle of the arrangement 1 has a greater conduction cross section, perpendicular to the current direction, than the terminal tongue 5b of an inner load current terminal, but also than the terminal tongue 5c, and therefore compared with all remaining terminal tongues of the contacting device 5. The contacting device 5' provided for the opposite current direction is configured correspondingly, and has a terminal tongue 5a' of an outermost load current terminal with a greater conduction cross section compared with the terminal tongues 5b' and 5c' of the remaining load current terminals of the same contacting device 5'. In the present case, this cross-sectional difference is achieved by a greater width $B_a$ or $B'_a$, respectively, of the outer terminal tongues 5a or 5'a, respectively, compared with the inner terminal tongues 5b, 5c or 5'b, 5'c.

Figure 3:
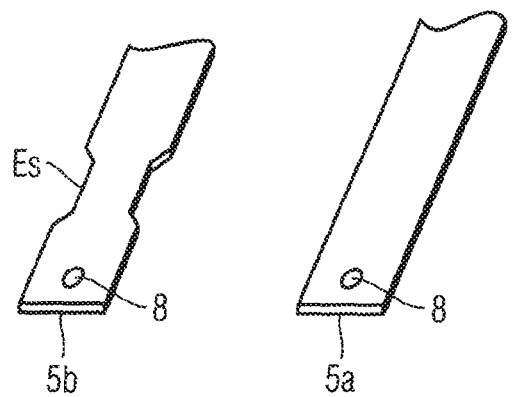
FIG. 3 depicts a terminal tongue for an inner load current terminal, according to an embodiment.
Figure 4:
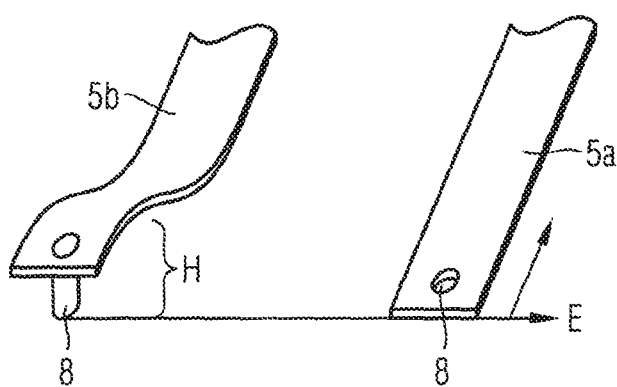
FIG. 4 depicts a terminal tongue for an inner load current terminal, according to another embodiment.
Figure 5:
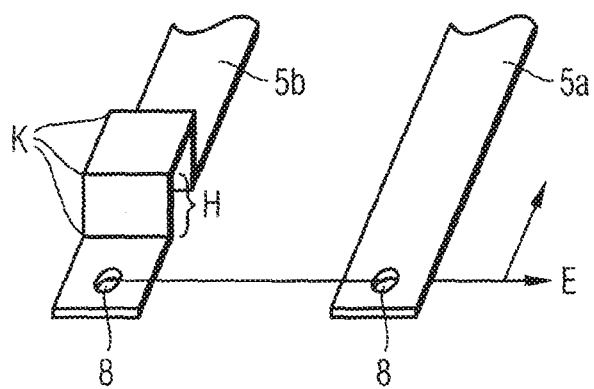
FIG. 5 depicts a terminal tongue for an inner load current terminal, according to another embodiment.
Figure 6:
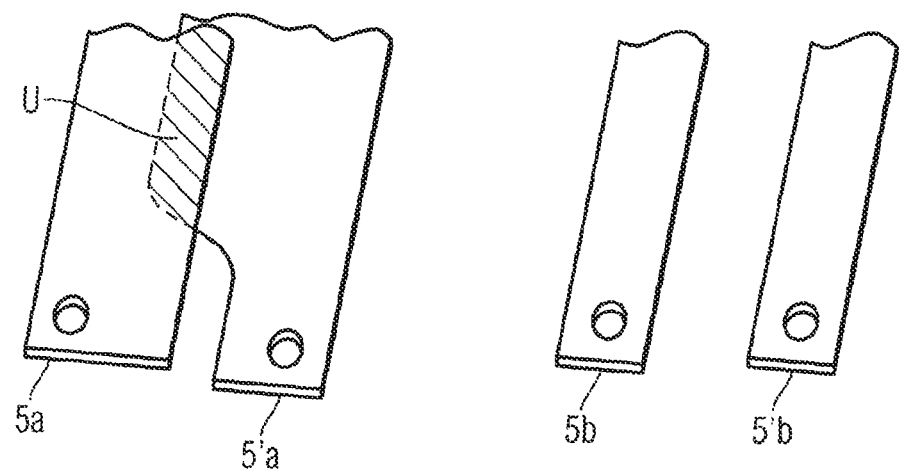
FIG. 6 depicts a terminal tongue for an inner load current terminal, according to another embodiment.
Figure 7:
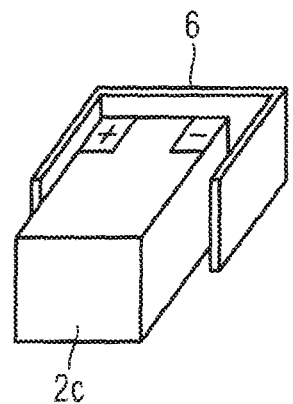
FIG. 7 depicts U-shaped metal sheet enclosing a half-bridge module.
Figure 8:
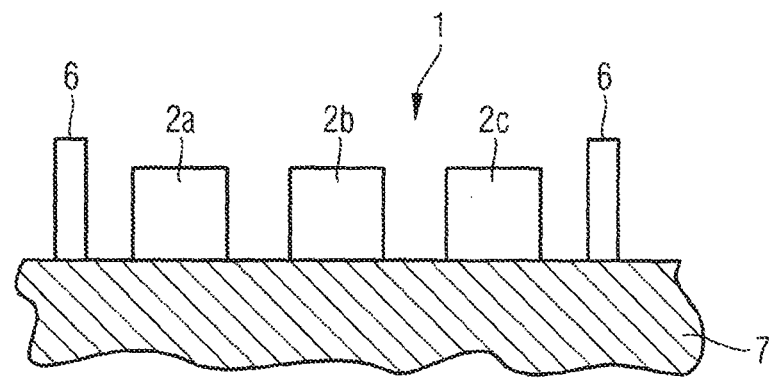
FIG. 8 depicts conductive layers 6 are fastened on a heat sink 7, according to an embodiment.

With the aid of FIGS. 3 to 6, other variants will be explained which illustrate measures according to the invention by which, applied individually or in combination to the relevant terminal tongues, induction matching can be achieved. FIG. 3 shows an embodiment in which, by means of a constriction ES of a terminal tongue 5b for an inner load current terminal, the associated inductance can be varied in comparison with a terminal tongue 5a of an outer load current terminal. FIG. 4 shows an embodiment in which, by means of a spacer, it is possible to achieve a profile and therefore an elevation H of a terminal tongue 5b for an inner load current terminal compared with a terminal tongue 5a of an outer load current terminal, and therefore a plane E defined by the fastening points 8 of the load current terminals. FIG. 5 shows an embodiment in which, by means of a plurality of bends, it is possible to achieve a profile and therefore an elevation H of a terminal tongue 5b for an inner load current terminal compared with a terminal tongue 5a of an outer load current terminal, and therefore a plane E defined by the load current terminals. FIG. 6 shows an embodiment in which the terminal tongues 5'a of an outer load current terminal differ in geometry from a terminal tongue 5'b of an inner load current terminal of the same contacting device 5', in such a way that the overlap U with the neighboring terminal tongues 5a or 5b of the contacting device 5 of the opposite load current direction is different. The aforementioned measures are suitable for influencing the effective inductance in the load current input or load current output, and therefore counteracting a nonuniformity, resulting from the arrangement of the modules, in the switching behavior due to magnetic interactions. In addition to these measures, further measures may be envisaged, which are intended to be illustrated schematically with the aid of FIGS. 7 and 8. For additional inductance matching, in particular of the outer power semiconductor switching elements or modules 2c, a conductive layer 6, for example in the form of a U-shaped metal sheet enclosing the relevant module 2c, is for example provided. FIG. 8 shows an embodiment in which conductive layers 6 are fastened on a heat sink 7 and respectively extend parallel and in immediate proximity to a side of the outer modules 2c of the power semiconductor arrangement 1. By induction of eddy currents in the respective layer 6 magnetic shielding is achieved, which has an assisting effect in the inductance matching resulting from the geometry variation and profile variation of the terminal tongues.

What is claimed is:

1. A power semiconductor arrangement, comprising:
a multiplicity of power semiconductor switching elements of the same type arranged in a plane and to be connected in parallel, the switching elements comprising a load current terminal for a load current input and a load current terminal for a load current output,
wherein the power semiconductor arrangement defines at least one outer load current terminal and at least one inner load current terminal per load current direction comprising a load current input and a load current output,
wherein the power semiconductor arrangement furthermore comprises at least one contacting device for common electrical contacting all of the load current terminals of a load current direction comprising a load current input and a load current output, wherein the contacting device comprises a plurality of terminal tongues which are respectively fastened on an associated load current terminal, and
wherein the geometry and/or the profile of the terminal tongue of an outer load current terminal differs from the geometry and/or the profile of the terminal tongue of an inner load current terminal of the at least one contacting device.

2. The power semiconductor arrangement as claimed in claim 1, wherein the terminal tongue fastened on the inner load current terminal has a different minimum cross section compared with the terminal tongue, fastened on the outer load current terminal of the at least one contacting device.

3. The power semiconductor arrangement as claimed in claim 1, wherein the profile of the terminal tongue fastened on the inner load current terminal has a different number of bends and/or a different number of curvatures and/or a different curvature of the at least one contacting device compared with the terminal tongue fastened on the outer load current terminal.

4. The power semiconductor arrangement as claimed in claim 1, wherein the terminal tongue fastened on the inner load current terminal has a different number of slots and/or a different number of constrictions compared with the terminal tongue fastened on the outer load current terminal.

5. The power semiconductor arrangement as claimed in claim 1, wherein the terminal tongue fastened on the inner load current terminal has a different overlap with a terminal tongue of another contacting device with the opposite load current direction, compared with the terminal tongue, fastened on the outer load current terminal, of the at least one contacting device of the one load current direction.

6. The power semiconductor arrangement as claimed in claim 1, wherein the fastening points of the associated terminal tongues of one of the load current directions comprising a load current input and a load current output are arranged in a common imaginary plane or a common imaginary line and the terminal tongue fastened on the inner load current terminal has a different for example larger elevation facing away from the associated load current terminal compared with the terminal tongue fastened on the outer load current terminal with respect to the plane or line.

7. The power semiconductor arrangement as claimed in claim 1, wherein a conductive layer for magnetic shielding is further provided.

8. The power semiconductor arrangement as claimed in claim 7, wherein an outer load current terminal differs in terms of the minimum distance from the conductive layer from an inner load current terminal of the at least one contacting device.

9. The power semiconductor arrangement as claimed in claim 8, wherein the minimum distance of an outer load current terminal from the conductive layer is less than the minimum distance of an inner load current terminal from the electrically insulated conductive layer.

10. The power semiconductor arrangement as claimed in claim 1, wherein the conductive layer comprises soft magnetic material, such as ferromagnetic material, a metal such as copper, aluminum, iron, and/or a metal alloy such as steel or a nickel/iron alloy.

11. The power semiconductor arrangement as claimed in claim 1, wherein the conductive layer extends at least in sections along one of the extent directions of the power semiconductor arrangement, and extends exclusively along one of the extent directions of the power semiconductor arrangement.

12. The power semiconductor arrangement as claimed in claim 1, wherein the power semiconductor arrangement comprises a heat sink and the conductive layer is fastened on the heat sink or is formed thereby.

13. The power semiconductor arrangement as claimed in claim 12, wherein the conductive layer is provided by a further electrical terminal device of the power semiconductor arrangement.

14. The power semiconductor arrangement as claimed in claim 1, wherein the power semiconductor arrangement comprises a plurality of modules containing a subset consisting of one or more power semiconductor switching elements, and the modules respectively comprise a module housing enclosing the respective subset.

15. The power semiconductor arrangement as claimed in claim 14, wherein the module housings of the power semiconductor arrangement are configured identically.

16. The power semiconductor arrangement as claimed in claim 15, wherein the module housings have long and short sides respectively perpendicular to the plane, and are arranged in such a way that, apart from one side of the outermost module housing, a long side of a module housing is respectively arranged in immediate proximity, for example adjacent, to a side of another module housing.

17. A method of using the semiconductor arrangement as claimed in claim 1 as a power converter.

* * * * *